(12) United States Patent
Tasaka

(10) Patent No.: US 6,376,887 B2
(45) Date of Patent: *Apr. 23, 2002

(54) SEMICONDUCTOR MEMORY HAVING BURIED DIGIT LINES

(75) Inventor: Kazuhiro Tasaka, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 4 days.

(21) Appl. No.: 09/318,734

(22) Filed: May 26, 1999

(30) Foreign Application Priority Data

May 26, 1998 (JP) .......................... 10-144312

(51) Int. Cl.[7] .................. H01L 29/76; H01L 29/94; H01L 31/062; H01L 31/113; H01L 31/119
(52) U.S. Cl. ...................... 257/391; 257/390
(58) Field of Search ................. 257/391, 390

(56) References Cited

U.S. PATENT DOCUMENTS 5,340,769 A  *  8/1994  Miyamoto .................. 438/296

FOREIGN PATENT DOCUMENTS

| JP | 5-3303 | 1/1993 |
|---|---|---|
| JP | 5-102436 | 4/1993 |
| JP | 5-259410 | 10/1993 |
| JP | 8-46024 | 2/1996 |

* cited by examiner

Primary Examiner—Sara Crane
Assistant Examiner—Thien F. Tran
(74) Attorney, Agent, or Firm—McGinn & Gibb, PLLC

(57) ABSTRACT

A semiconductor memory comprises a gate electrode formed on a gate oxide film formed in each of active regions on a principal surface of a semiconductor substrate, grooves formed in self alignment with the gate electrode and to penetrate the inside of the semiconductor substrate, a buried digit line formed of a diffused layer which is formed at an inner surface of each of the grooves and which is of a conductivity type opposite to that of the semiconductor substrate, a chemical vapor deposition (CVD) oxide film formed to cover the surface of each of the grooves and at least a portion of a side surface of the gate electrode, a borophsphosilicate glass (BPSG) film filled up in the grooves, and a word line formed on the principal surface of the semiconductor substrate to extend orthogonally to the grooves, and constituting the gate electrode on the active region and functioning as an interconnection layer on the grooves.

14 Claims, 4 Drawing Sheets

4 OXIDE FILM
3 POLYSILICON FILM
2 GATE OXIDE FILM
1 P-TYPE SILICON SUBSTRATE

5 PHOTORESIST FILM
6 ACTIVE REGION

As⁺

7A GROOVE

10 BPSG FILM
9 CVD OXIDE FILM
8 BURIED DIGIT LINE

11 TUNGSTEN SILICIDE FILM
12 POLYCIDE GATE ELECTRODE
6 ACTIVE REGION

SEMICONDUCTOR MEMORY HAVING BURIED DIGIT LINES

BACKGROUND OF THE INVENTION

1. Field of the Invention

The present invention relates to a semiconductor memory and a method for fabricating the same, and more specifically to a structure of a semiconductor memory such as a large-storage-capacity NOR type mask ROM, having buried digit lines, and a method for fabricating the same.

2. Description of Related Art

Now, a prior art will be described with reference to FIGS. 3 and 4. FIG. 3 is a plan view for illustrating a general cell layout in the NOR type mask ROM having buried digit lines. A plurality of buried digit lines 8 and active regions 6 are alternately located. A plurality of word lines 13 extend orthogonally to the buried digit lines 8. A region surrounded by a dotted line in FIG. 3 corresponds to a unitary cell. In FIG. 3, "L" indicates a channel length, and "W" indicates a channel width.

Next, a method in accordance with the prior art for fabricating the NOR type mask ROM having buried digit lines will be described with reference to FIGS. 4A to 4D, which are diagrammatic sectional views taken along the line A—A in FIG. 3 for illustrating the prior art method.

As shown in FIG. 4A, an oxide film 4 is formed on a P-type silicon substrate 1, and a photoresist film 5 is formed on the oxide film 4, and then patterned to have an opening at a region which is positioned between each pair of adjacent active regions 6 and where a buried digit line is to be formed in future. Then, as shown in FIG. 4B, N-type impurity, for example, arsenic, is implanted into the substrate 1 using the patterned photoresist film 5 as a mask. As a result, buried digit lines 8 are formed. After the photoresist film 5 and the oxide film 4 are removed, oxidation is carried out so that a gate oxide film 2 is formed on the surface of the substrate 1 as shown in FIG. 4C. Further, a polysilicon film 3 and a tungsten silicide film 11 are formed on the whole surface as shown in FIG. 4D, and then, are selectively removed so that the word line 13 constituted of a polycide gate electrode 12 formed of the tungsten silicide film 11 and the polysilicon film 3, is formed on the active region 6.

Incidentally, an example of the NOR type mask ROM is disclosed by Japanese Patent Application Pre-examination Publication No. JP-A-05-003303 (an English abstract of JP-A-05-003303 is available and the content of the English abstract is incorporated by reference in its entirety into this application).

In the above mentioned NOR type mask ROM, a layer resistance of the buried digit line is desired to be maintained even if the cell size is reduced, from the viewpoint of a demand in a circuit for ensuring a high speed operation margin. On the other hand, a margin of the channel length in a cell transistor (Lmin) should be ensured. For this purpose, it is desirable to reduce the dose of the N-type impurity in order to suppress a lateral diffusion. However, this results in an increased layer resistance of the buried digit line. Namely, the maintaining of the layer resistance of the buried digit line and the ensuring of the channel length margin (Lmin) of the cell transistor are a tradeoff relation against each other. In the prior art, therefore, it is difficult to reduce the cell size while simultaneously realizing both of the maintaining of the layer resistance of the buried digit line and the ensuring of the channel length margin (Lmin) of the cell transistor.

SUMMARY OF THE INVENTION

Accordingly, it is an object of the present invention to provide a semiconductor memory having a buried digit line, which has overcome the above mentioned problem of the prior art, and a method for fabricating the same.

Another object of the present invention is to provide a semiconductor memory having buried digit lines, which can reduce the cell size while simultaneously realizing both of the maintaining of the layer resistance of the buried digit line and the ensuring of the channel length margin of the cell transistor, and a method for fabricating the same.

The above and other objects of the present invention are achieved in accordance with the present invention by a semiconductor memory comprising a semiconductor substrate having a principal surface, a gate electrode which is formed on a gate insulator film formed in an active region on the principal surface of the semiconductor substrate and which is formed of a semiconductor layer and a conducting layer, grooves formed in self alignment with the gate electrode and to penetrate the inside of the semiconductor substrate, a buried digit line formed of a diffused layer which is formed within each of the grooves and which is of a conductivity type opposite to that of the semiconductor substrate, a first insulating film covering a surface of each of the grooves and at least a portion of a side surface of the gate electrode, a second insulating film filled up in the grooves and having a high reflow property, and a word line formed on the principal surface of the semiconductor substrate to extend orthogonally to the grooves, and constituting the gate electrode on the active region and functioning as an interconnection layer on the grooves.

According to another aspect of the present invention, there is provided a method for fabricating a semiconductor memory, comprising the steps of:

forming a semiconductor layer on a gate insulator film formed on a principal surface of a semiconductor substrate;

forming grooves to penetrate the inside of the semiconductor substrate in buried digit line formation regions which locate an active region between each pair of adjacent buried digit line formation regions;

introducing impurity of a conductivity type opposite to that of the semiconductor substrate, into at least a surface of the grooves in the semiconductor substrate;

depositing a first insulating film on the semiconductor substrate;

depositing a second insulating film having a high reflow property, to fill up the grooves having the surface covered with the first insulating film, and to planarize a surface of the semiconductor substrate;

removing the first insulating film and the second insulating film to allow the first insulating film and the second insulating film to remain only within the grooves;

forming a conducting layer on the semiconductor substrate; and selectively partially removing the conducting layer and the semiconductor layer to form a word line extending on the principal surface of the semiconductor substrate orthogonally to the grooves, and constituting the gate electrode on the active region and functioning as an interconnection layer on the grooves.

With the above mentioned arrangement, even if the cell size is reduced, it is possible at least to maintain the layer resistance of the buried digit line.

In addition, if the grooves are formed to have a V-shape in a cross-section, even if the cell area is reduced, it is possible to simultaneously realize at least the maintaining and preferably the reducing of the layer resistance of the buried digit line, and the ensuring of the gate length margin (Lmin) of the cell transistor.

The grooves can be formed by performing an etching using a patterned photoresist film formed on the semiconductor layer as a mask, or alternatively by patterning an insulating film formed on the semiconductor layer and performing an etching using the patterned insulating film as a mask.

Preferably, the first insulating film covering a surface of each of the grooves and at least the portion of the side surface of the gate electrode, has an etching rate smaller than that of the second insulating film having a high reflow property and filling up the grooves.

In addition, the step of introducing the impurity of the conductivity type opposite to that of the semiconductor substrate, into at least the surface of the grooves in the semiconductor substrate, can be carried out by a slant rotating ion implantation.

Alternatively, the grooves are formed by performing an etching using a patterned photoresist film formed on the semiconductor layer as a mask, and in the step of introducing the impurity of the conductivity type opposite to that of the semiconductor substrate, into at least the surface of the grooves in the semiconductor substrate, the impurity is introduced into the semiconductor layer which was not doped the impurity to have the conductivity type opposite to that of the semiconductor substrate.

Furthermore, the semiconductor layer is formed of a polysilicon film or an amorphous silicon film. The semiconductor layer can be doped with impurity to have the conductivity type opposite to that of the semiconductor substrate when the semiconductor layer is formed, or alternatively, in a later step, the semiconductor layer can be doped with impurity to have the conductivity type opposite to that of the semiconductor substrate.

In addition, the conducting layer can be formed of a refractory metal film such as a tungsten silicide film, or alternatively can be formed of a polysilicon film or an amorphous silicon film.

The above and other objects, features and advantages of the present invention will be apparent from the following description of preferred embodiments of the invention with reference to the accompanying drawings.

DESCRIPTION OF THE PREFERRED EMBODIMENTS

In the following, embodiments of the present invention will be described with reference to the accompanying drawings.

First Embodiment

Figure 1A:
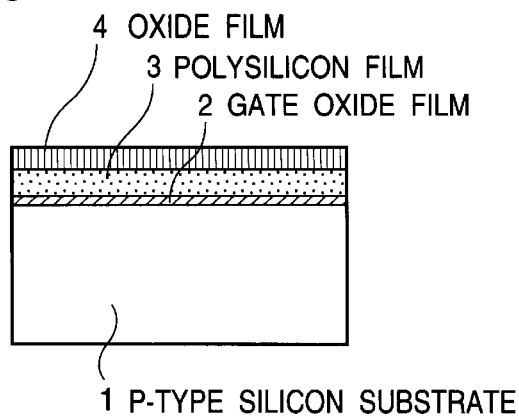
FIGS. 1A to 1G are diagrammatic sectional views of the NOR type mask ROM having buried digit lines, for illustrating a first embodiment of the method in accordance with the present invention for fabricating the NOR type mask ROM.
Figure 1B:
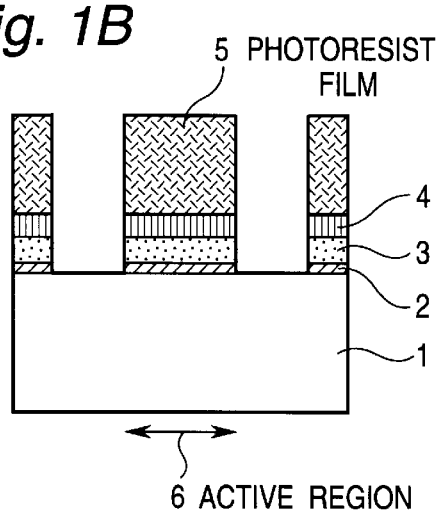
Figure 1C:
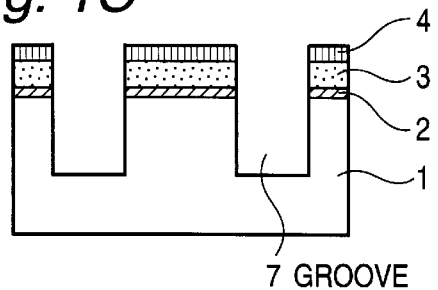
Figure 1D:
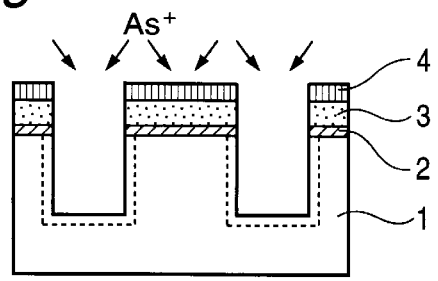
Figure 1E:
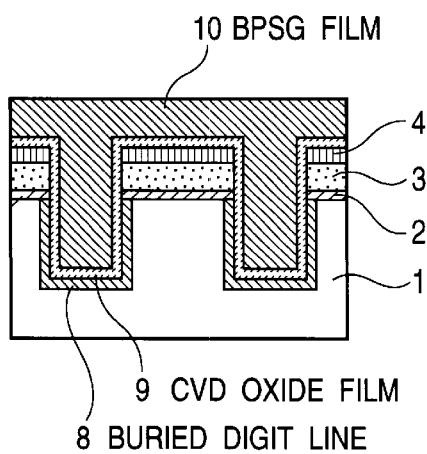
Figure 1F:
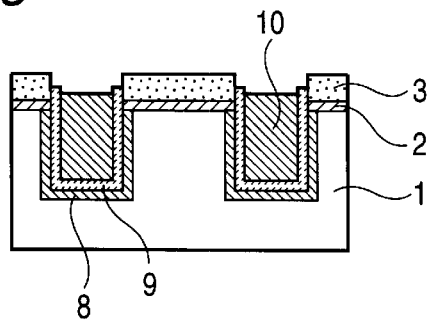
Figure 1G:
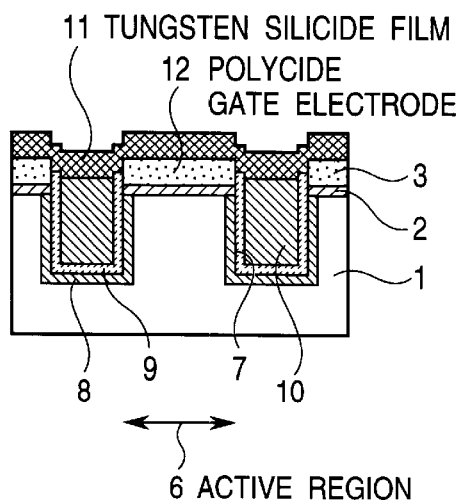
Figure 3:
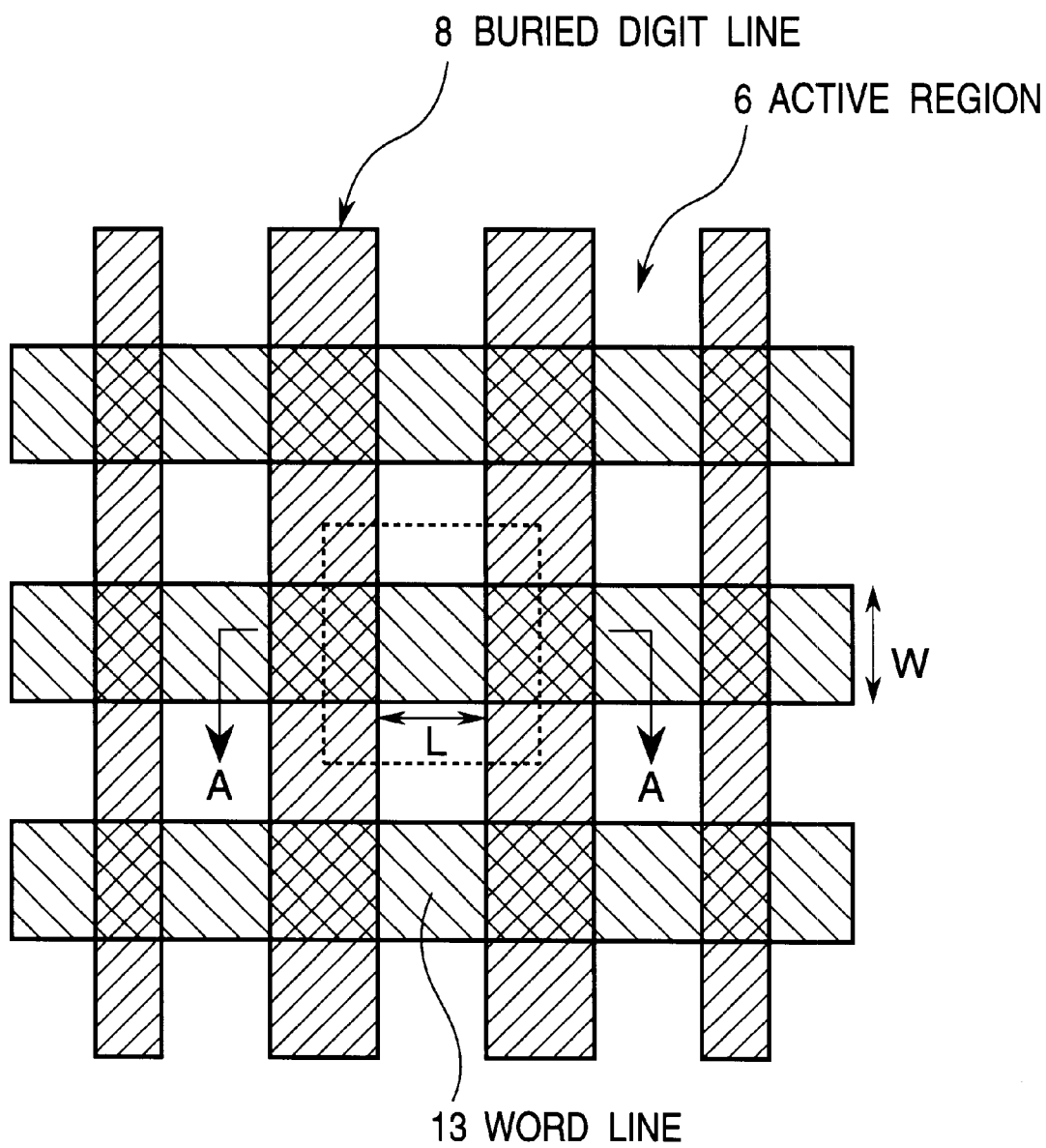
FIG. 3 is a plan view for illustrating a general cell layout in the NOR type mask ROM having buried digit lines.
Figure 4A:
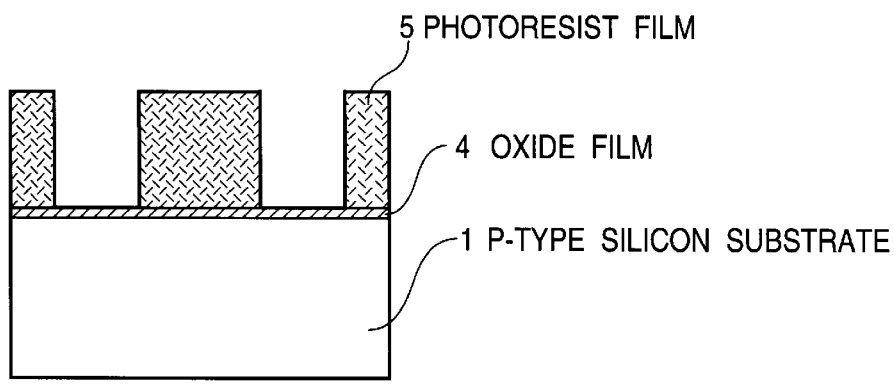
FIGS. 4A to 4D are diagrammatic sectional views for illustrating a method in accordance with the prior art for fabricating the NOR type mask ROM having buried digit lines.
Figure 4B:
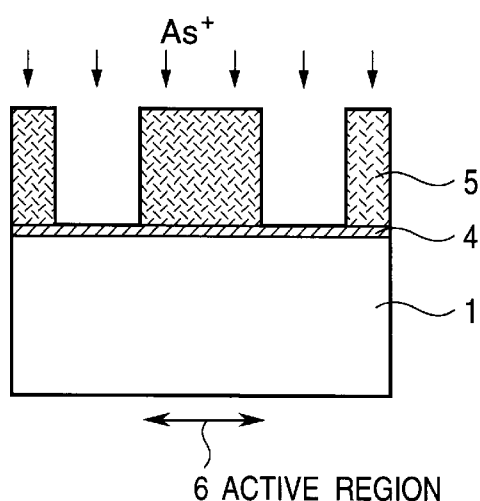
Figure 4C:
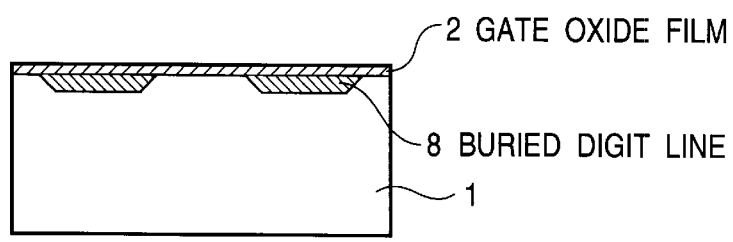
Figure 4D:
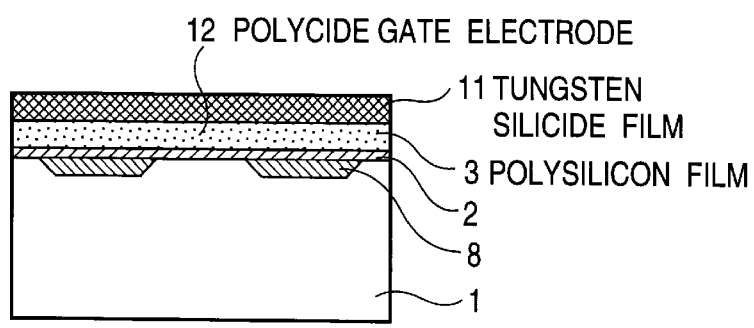

FIGS. 1A to 1G are diagrammatic sectional views for illustrating a first embodiment of the method in accordance with the present invention for fabricating the NOR type mask ROM having buried digit lines, and FIG. 1G shows a sectional structure of the NOR type mask ROM fabricated in accordance with that method, and corresponds to a sectional view taken along the line A—A in FIG. 3.

As shown in FIG. 1G, the first embodiment of the NOR type mask ROM in accordance with the present invention having buried digit lines includes a gate electrode 12 which is located on a gate oxide film 2 formed in an active region 6 on a principal surface of a P-type silicon substrate 1 and which is formed of a polysilicon film 3 and a tungsten silicide film 11. The NOR type mask ROM further includes grooves 7 having a rectangular vertical cross-sectional shape, formed to penetrate the inside of the P-type silicon substrate in a self-alignment with the active regions 6 so that each of the active regions 6 is confined between each pair of adjacent grooves. In addition, the NOR type mask ROM includes a buried digit line 8 formed of an $N^+$ diffused layer formed at an inner surface of each groove 7, a CVD (chemical vapor deposition) oxide film 9 formed to cover the buried digit line 8 in each groove 7 and at least a portion of a side surface of the gate electrode 12, and a BPSG (borophosphosilicate glass) film 10 filled up in each groove 7 and having an etching rate higher than that of the CVD oxide film 9. Moreover, the NOR type mask ROM includes a word line 13 which is orthogonal to the grooves 7 (namely, the buried digit lines 8) and which is constituted of an interconnection layer formed, on each active region, of a polycide gate electrode 12 composed of the polysilicon film 3 and the tungsten silicide film 11, and on each groove 7, of only the tungsten silicide film 11.

Now, a first embodiment of the method in accordance with the present invention for fabricating the first embodiment of the NOR type mask ROM in accordance with the present invention, will be described with reference to FIGS. 1A to 1G.

As shown in FIG. 1A, the gate oxide film 2 having a thickness of 0.005 $\mu$m to 0.03 $\mu$m, the polysilicon film 3 having a thickness of 0.1 $\mu$m to 0.3 $\mu$m, and an oxide film 4 having a thickness of 0.1 $\mu$m to 0.3 $\mu$m, are formed on the principal surface of the P-type silicon substrate 1 in the named order.

As shown in FIG. 1B, by using a patterned photoresist film 5 as a mask, the oxide film 4, the polysilicon film 3 and the gate oxide film 2 are etched in the named order. After the photoresist film 5 is removed, as shown in FIG. 1C, the P-type silicon substrate 1 is etched using the patterned oxide film 4 as a mask, so that the grooves 7 having a width of 0.2 $\mu$m to 0.5 $\mu$m and having a rectangular vertical cross-sectional shape are formed in buried digit line formation regions located and se grated to put one active region 6 between each pair of adjacent buried digit line formation regions. After the polysilicon film 3 is formed, the grooves 7 can be formed using the patterned photoresist film 5 as a mask, without forming the oxide film 4.

Thereafter, as shown in FIG. 1D, an N-type impurity, for example, arsenic, is implanted on the whole surface of the silicon substrate 1 by a slant rotating ion implantation under an energy of 40 keV to 100 keV and a dose of $1\times10^{14}/cm^2$ to $6\times10^{15}/cm^2$, so that a buried digit line 8 is formed at an inner surface of each groove 7.

As shown in FIG. 1E, the CVD oxide film 9 having a thickness of 0.1 $\mu$m to 0.3 $\mu$m and the BPSG oxide film 10 having a thickness of 0.2 $\mu$m to 1.0 $\mu$m, are formed on the P-type silicon substrate 1 in the named order, and an annealing is carried out for 5 minutes to 50 minutes in a nitrogen atmosphere of 800° C. to 950° C., so that the grooves 7 are filled up with the BPSG film 10 and the surface of the substrate 1 (namely, the surface of the BPSG film 10) is planarized.

As shown in FIG. 1F, an etching-back is carried out by a dry etching using the polysilicon film 3 as a stopper, so that the CVD oxide film 9 and the BPSG oxide film 10 are left only within the grooves 7. In this etching-back process, since the etch rate of the CVD oxide film 9 is smaller than that of the BPSG oxide film 10, even if the etching-back becomes an over-etching, the P-type silicon substrate 1 is never exposed at the side surface of the grooves 7.

As shown in FIG. 1G, the tungsten silicide film 11 is formed on the whole surface. Thereafter, the tungsten silicide film 11 and the polysilicon film 3 are selectively partially removed to form the word lines 13 each of which extends on the surface of the P-type silicon substrate 1 orthogonally to the grooves 7 and each of which is constituted of an interconnection layer formed, on each active region 6, of the polycide gate electrode 12 composed of the polysilicon film 3 and the tungsten silicide film 11, and on each groove 7, of only the tungsten silicide film 11.

As mentioned above, in the first embodiment of the NOR type mask ROM in accordance with the present invention, since the whole of the inner surface of the groove 7 formed in the P-type silicon substrate 1 can be used for the buried digit line, even if the cell area is reduced, it is possible at least to maintain and preferably to reduce the layer resistance of the buried digit lines, differently from the prior art.

Second Embodiment

Figure 2A:
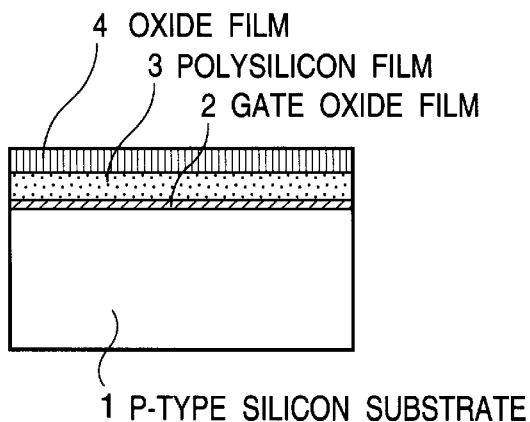
FIGS. 2A to 2G are diagrammatic sectional views of the NOR type mask ROM having buried digit lines, for illustrating a second embodiment of the method in accordance with the present invention for fabricating the NOR type mask ROM.
Figure 2B:
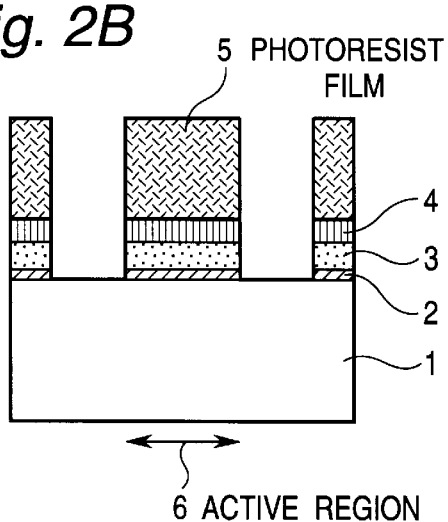
Figure 2C:
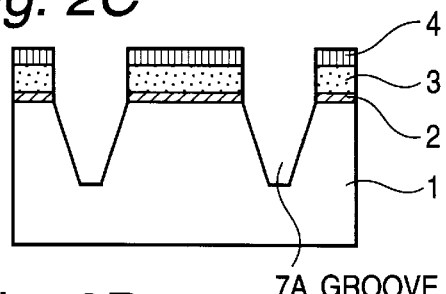
Figure 2D:
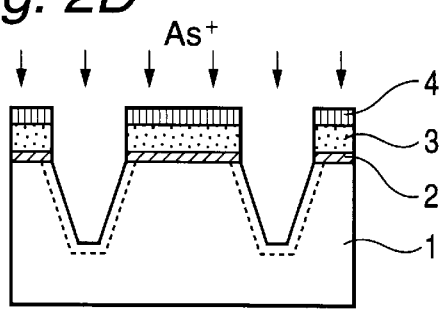
Figure 2E:
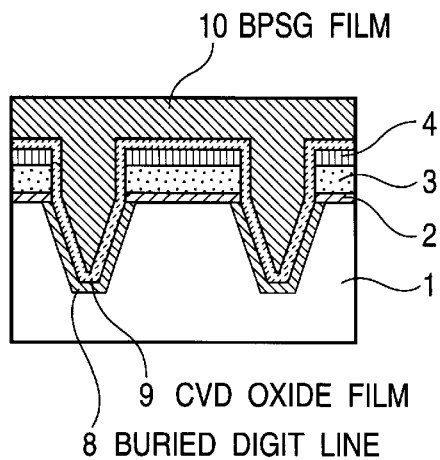
Figure 2F:
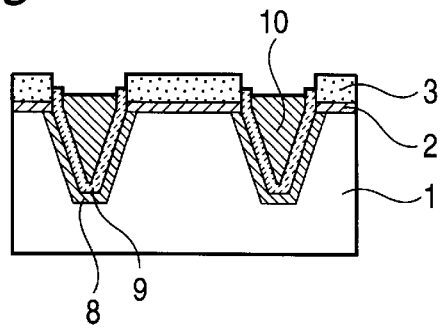
Figure 2G:
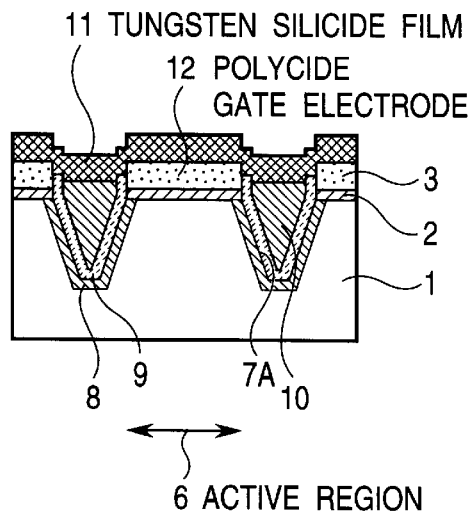

FIGS. 2A to 2G are diagrammatic sectional views for illustrating a second embodiment of the method in accordance with the present invention for fabricating the NOR type mask ROM having buried digit lines, and FIG. 2G shows a sectional structure of the NOR type mask ROM fabricated in accordance with that method, and corresponds to a sectional view taken along the line A—A in FIG. 3.

As shown in FIG. 2G, the second embodiment of the NOR type mask ROM in accordance with the present invention having buried digit lines includes a gate electrode 12 which is located on a gate oxide film 2 formed in an active region 6 on a principal surface of a P-type silicon substrate 1 and which is formed of a polysilicon film 3 and a tungsten silicide film 11. The NOR type mask ROM further includes grooves 7A having a triangular vertical cross-sectional shape having a tapering bottom end (V-shaped groove), formed to penetrate the inside of the P-type silicon substrate in a self-alignment with the active regions 6 so that each of the active regions 6 is confined between each pair of adjacent grooves. In addition, the NOR type mask ROM includes a buried digit line 8 formed of an N⁺ diffused layer formed at an inner surface of each groove 7A, a CVD oxide film 9 formed to cover the buried digit line 8 in each groove 7A and at least a portion of a side surface of the gate electrode 12, and a BPSG film 10 filled up in each groove 7A and having an etching rate higher than that of the CVD oxide film 9. Moreover, the NOR type mask ROM includes a word line 13 which is orthogonal to the grooves 7A (namely, the buried digit lines 8) and which is constituted of an interconnection layer formed, on each active region, of a polycide gate electrode 12 composed of the polysilicon film 3 and the tungsten silicide film 11, and on each groove 7A, of only the tungsten silicide film 11.

Now, a second embodiment of the method in accordance with the present invention for fabricating the second embodiment of the NOR type mask ROM in accordance with the present invention, will be described with reference to FIGS. 2A to 2G.

As shown in FIG. 2A, the gate oxide film 2 having a thickness of 0.005 $\mu$m to 0.03 $\mu$m, the polysilicon film 3 having a thickness of 0.1 $\mu$m to 0.3 $\mu$m, and an oxide film 4 having a thickness of 0.1 $\mu$m to 0.3 $\mu$m, are formed on the principal surface of the P-type silicon substrate 1 in the named order.

As shown in FIG. 2B, by using a patterned photoresist film 5 as a mask, the oxide film 4, the polysilicon film 3 and the gate oxide film 2 are etched in the named order. After the photoresist film 5 is removed, as shown in FIG. 2C, the P-type silicon substrate 1 is etched using the patterned oxide film 4 as a mask, so that the V-shaped grooves 7A having a width of 0.2 $\mu$m to 0.5 $\mu$m are formed in buried digit line formation regions located and separated to put one active region 6 between each pair of adjacent buried digit line formation regions. After the polysilicon film 3 is formed, the grooves 7A can be formed using the patterned photoresist film 5 as a mask, without forming the oxide film 4, similarly to the first embodiment.

Thereafter, as shown in FIG. 2D, an N-type impurity, for example, arsenic, is implanted on the whole surface of the silicon substrate 1 by an implantation at an implanting angle of 0 degree under an energy of 40 keV to 100 keV and a dose of $1 \times 10^{14}/cm^2$ to $6 \times 10^{15}/cm^2$, so that a buried digit line 8 is formed at an inner surface of each groove 7A.

As shown in FIG. 2E, the CVD oxide film 9 having a thickness of 0.1 $\mu$m to 0.3 $\mu$m and the BPSG oxide film 10 having a thickness of 0.2 $\mu$m to 1.0 $\mu$m, are formed on the P-type silicon substrate 1 in the named order, and an annealing is carried out for 5 minutes to 50 minutes in a nitrogen atmosphere of 800° C. to 950° C., so that the grooves 7A are filled up with the BPSG film 10 and the surface of the substrate 1 (namely, the surface of the BPSG film 10) is planarized.

As shown in FIG. 2F, an etching-back is carried out by a dry etching using the polysilicon film 3 as a stopper, so that the CVD oxide film 9 and the BPSG oxide film 10 are left only within the grooves 7A. In this etching-back process, since the etch rate of the CVD oxide film 9 is smaller than that of the BPSG oxide film 10, even if the etching-back becomes an over-etching, the P-type silicon substrate 1 is never exposed at the side surface of the grooves 7A.

As shown in FIG. 2G, the tungsten silicide film 11 is formed on the whole surface. Thereafter, the tungsten silicide film 11 and the polysilicon film 3 are selectively partially removed to form the word lines 13 each of which extends on the surface of the P-type silicon substrate 1 orthogonally to the grooves 7A and each of which is constituted of an interconnection layer formed, on each active region 6, of the polycide gate electrode 12 composed of the polysilicon film 3 and the tungsten silicide film 11, and on each groove 7A, of only the tungsten silicide film 11.

As mentioned above, in the second embodiment of the NOR type mask ROM in accordance with the present invention, the whole of the inner surface of the groove 7A formed in the P-type silicon substrate 1 can be used for the buried digit line. In addition, since the groove 7A is a V-shape in a vertical cross-section, the slant rotating ion implantation is no longer necessary in the N-type impurity implantation for forming the buried digit line 8 at the inner surface of the grooves 7, and also, the deeper the level along the V-shaped groove becomes, a spacing between each pair of adjacent buried digit lines becomes larger, so that it becomes possible to suppress a punch-through at a deep position, which cannot be controlled by the polycide gate electrode 12. Therefore, even if the cell area is reduced, the second embodiment can simultaneously realize at least the maintaining and preferably the reducing of the layer resistance of the buried digit line, and the ensuring of the gate length margin (Lmin) of the cell transistor.

As mentioned above, the following advantages can be obtained according to the present invention.

(1) The gate length margin (Lmin) of the cell transistor can be ensured. The reason for this is that, since the groove is a V-shape in a vertical cross-section, it is possible to avoid the punch-through between a source and a drain at a deep position.
(2) It is possible at least to maintain and preferably to reduce the layer resistance of the buried digit line. The reason for this is that the inner surface area of the groove can be ensured and increased by adjusting the depth and the shape of the groove.
(3) It is possible to suppress a seeping-out of the code boron in a channel direction of the cell transistor, because the cell transistors are isolated from one another by the grooves in a channel direction.
(4) It is possible to reduce the capacitance of the word line, because the capacitance of the word line is reduced by the thickness of the insulator film corresponding to the depth of the groove.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor memory comprising:
   a semiconductor substrate having a principal surface;
   a gate electrode which is formed on a gate insulator film formed in an active region on said principal surface of said semiconductor substrate and which is formed of a semiconductor layer and a conducting layer;
   grooves formed in self alignment with said gate electrode and to penetrate the inside of said semiconductor substrate;
   a buried digit line formed of a continuous diffused layer which is formed at an entire inner surface of each of said grooves and which is of a conductivity type opposite to that of said semiconductor substrate;
   a first insulating film covering an inner surface of each of said grooves and at least a portion of a side surface of said semiconductor layer of said gate electrode;
   a second insulating film substantially filling said grooves and having a high reflow property; and
   a word line formed on said principal surface of said semiconductor substrate to extend orthogonally to said grooves, and comprising said gate electrode on said active region and functioning as an interconnection layer on said grooves.

2. The semiconductor memory claimed in claim 1 wherein said grooves have a V-shape cross-section.

3. The semiconductor memory claimed in claim 1 wherein said first insulating film has an etching rate smaller than that of said second insulating film.

4. The semiconductor memory claimed in claim 1 wherein said semiconductor layer comprises one of a polysilicon film and an amorphous silicon film.

5. The semiconductor memory claimed in claim 1 wherein said conducting layer comprises a refractory metal film.

6. The semiconductor memory claimed in claim 1 wherein said conducting layer comprises one of a polysilicon film and an amorphous silicon film.

7. The semiconductor memory claimed in claim 1 wherein said grooves are formed by performing an etching using a patterned photoresist film formed on the semiconductor layer as a mask.

8. The semiconductor memory claimed in claim 1 wherein said grooves are formed by patterning an insulating film formed on the semiconductor layer and performing an etching using the patterned insulating film as a mask.

9. The semiconductor memory claimed in claim 1 wherein an entirety of the inner surface of each of the grooves is used for receiving the buried digit line.

10. A semiconductor memory comprising:
    a semiconductor substrate having a principal surface;
    a polysilicon film formed on a gate insulator film formed on said principal surface of said semiconductor substrate in each of a plurality of active regions defined separately from each other;
    grooves formed in self alignment with said polysilicon film and to penetrate the inside of said semiconductor substrate;
    a plurality of buried digit lines each formed of a continuous diffused layer which is formed at an entire inner surface of each of said grooves and which is of a conductivity type opposite to that of said semiconductor substrate, so that said active regions and said buried digit lines are alternately located;
    a first insulating film covering the inner surface of each of said grooves and at least a portion of a side surface of said polysilicon film;
    a second insulating film substantially filling said grooves and having a high reflow property; and
    a metal silicide film formed as a word line on said principal surface of said semiconductor substrate to extend orthogonally to said grooves, so that, on said active region, a polycide gate electrode is composed of said polysilicon film and said metal silicide film.

11. The semiconductor memory claimed in claim 10, wherein said grooves have a rectangular cross-sectional shape.

12. The semiconductor memory claimed in claim 10, wherein said grooves have a V-shaped cross-section.

13. The semiconductor memory claimed in claim 10, wherein said first insulating film has an etching rate smaller than that of said second insulating film.

14. The semiconductor memory claimed in claim 10, wherein said metal silicide film comprises a refractory metal silicide film.

* * * * *